United States Patent
Wytman

Patent Number: 6,048,154
Date of Patent: *Apr. 11, 2000

[54] HIGH VACUUM DUAL STAGE LOAD LOCK AND METHOD FOR LOADING AND UNLOADING WAFERS USING A HIGH VACUUM DUAL STAGE LOAD LOCK

[75] Inventor: Joe Wytman, Los Gatos, Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/725,275

[22] Filed: Oct. 2, 1996

[51] Int. Cl.[7] ................................................ B65G 65/00
[52] U.S. Cl. .................. 414/217; 414/331.18; 414/416; 414/805; 414/811; 414/937; 414/939; 414/940
[58] Field of Search ...................... 414/217, 416, 414/331, 937, 939, 940, 786, 411, 805, 811, 331.14, 331.18; 204/298.25, 298.35; 118/719; 156/345

[56] References Cited

U.S. PATENT DOCUMENTS

| | | | |
|---|---|---|---|
| 3,954,191 | 5/1976 | Wittkower et al. | 214/17 B |
| 4,433,951 | 2/1984 | Koch et al. | 414/217 |
| 4,632,624 | 12/1986 | Mirkovich et al. | 414/217 |
| 4,724,874 | 2/1988 | Parikh et al. | 414/939 X |
| 4,727,993 | 3/1988 | Mirkovich et al. | 211/41 |
| 4,861,563 | 8/1989 | Shekerjian et al. | 422/186.05 |
| 5,058,526 | 10/1991 | Matsushita et al. | 118/715 |
| 5,112,277 | 5/1992 | Cruz et al. | 414/939 X |
| 5,277,579 | 1/1994 | Takanabe | 414/939 X |
| 5,388,944 | 2/1995 | Takanabe et al. | 414/939 X |
| 5,391,035 | 2/1995 | Krueger | 414/217 |
| 5,435,682 | 7/1995 | Crabb et al. | 414/939 X |
| 5,540,821 | 7/1996 | Tepman | 414/939 X |
| 5,562,383 | 10/1996 | Iwai et al. | 414/939 X |
| 5,586,585 | 12/1996 | Bonora et al. | 414/939 X |
| 5,613,821 | 3/1997 | Muka et al. | 414/939 X |
| 5,630,690 | 5/1997 | Salzman | 414/939 X |
| 5,636,963 | 6/1997 | Haraguchi et al. | 414/939 X |
| 5,752,796 | 5/1998 | Muka | 414/939 X |
| 5,788,458 | 8/1998 | Bonora et al. | 414/940 X |

FOREIGN PATENT DOCUMENTS

| | | |
|---|---|---|
| 0596537 | 5/1994 | European Pat. Off. . |
| 0651429 | 5/1995 | European Pat. Off. . |
| 1312074 | 12/1989 | Japan . |
| 48509 | 2/1994 | Japan ................ 414/939 |
| 6275698 | 9/1994 | Japan . |

*Primary Examiner*—David A. Bucci
*Attorney, Agent, or Firm*—Fulbright & Jaworski LLP

[57] ABSTRACT

A dual stage load lock is provided for transfer of semiconductor wafers between an environment at atmospheric pressure and a high vacuum environment, such as a wafer processing system. The dual stage load lock includes a first load lock chamber and a second load lock chamber separated by a dividing ledge which extends a distance inwardly from the inner wall of the load lock assembly. The lower load lock chamber selectively communicates with a transfer chamber of the processing system, and is maintained at high vacuum. The upper load lock chamber selectively communicates with the external environment at atmospheric pressure. Therefore, the environment of the upper load lock chamber may vary between atmospheric pressure, when wafers are transferred between the load lock and the outside environment, and high vacuum, when the wafers are transferred between the first and second chambers of the load lock. The load lock may include modular chamber segments that can be arranged in a variety of configurations. A method for transferring wafers through the load lock is also provided.

5 Claims, 7 Drawing Sheets

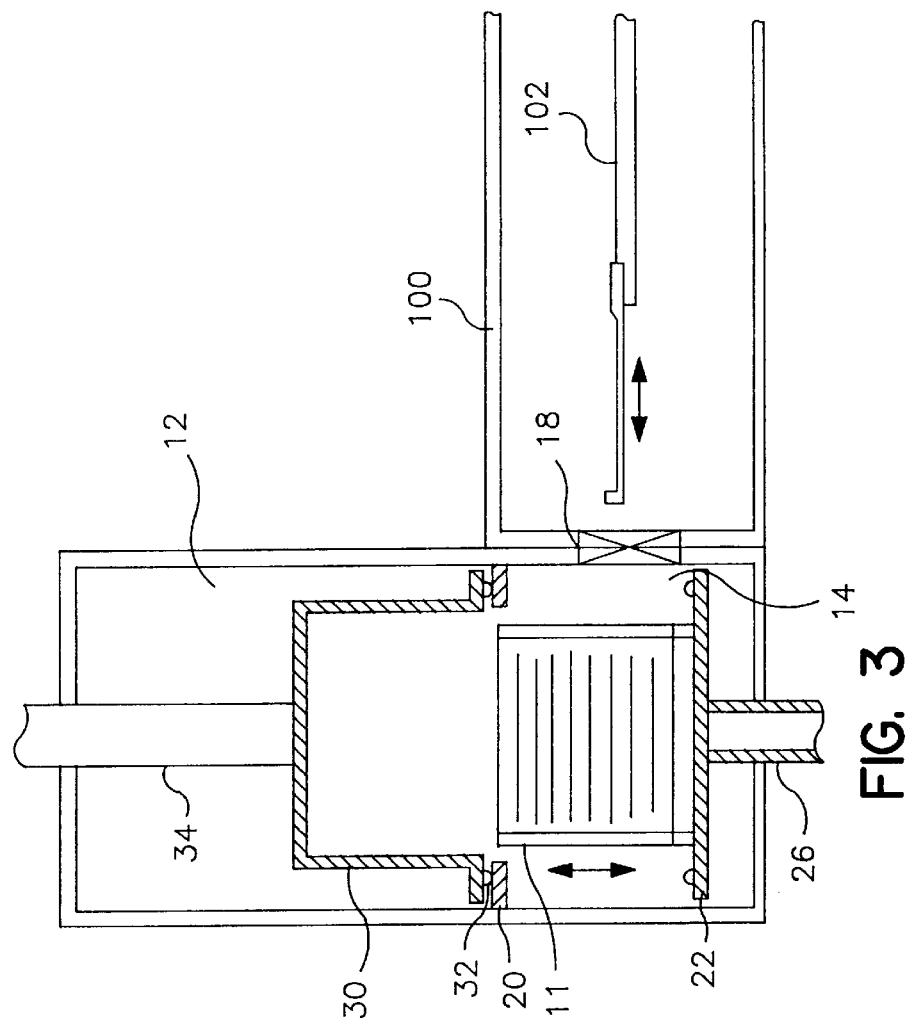
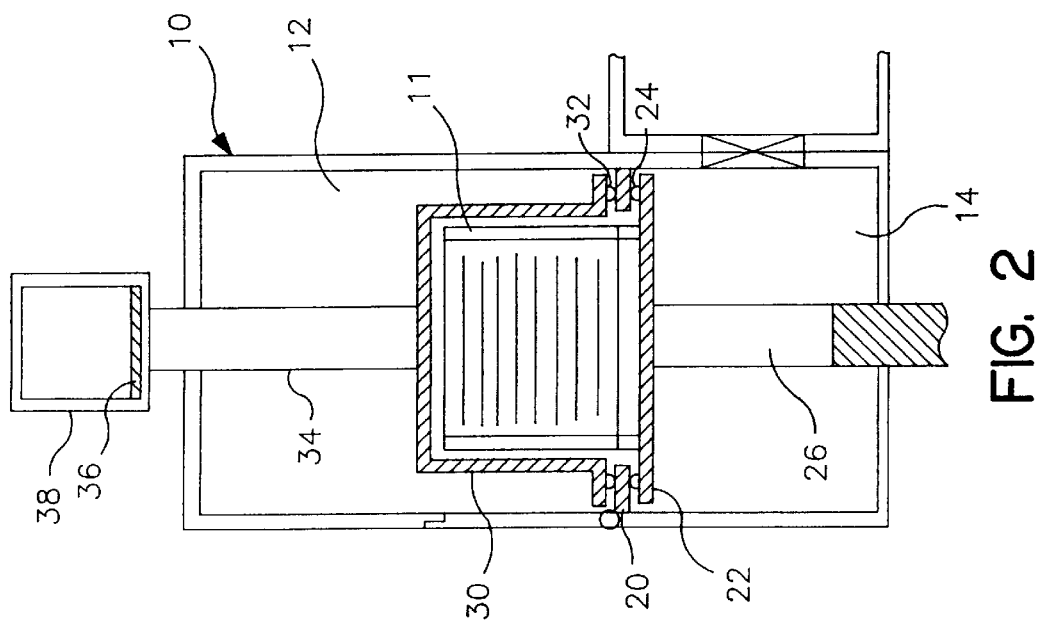

HIGH VACUUM DUAL STAGE LOAD LOCK AND METHOD FOR LOADING AND UNLOADING WAFERS USING A HIGH VACUUM DUAL STAGE LOAD LOCK

BACKGROUND OF THE INVENTION

The present invention relates to a load lock unit for transferring a cassette of semiconductor wafers between regions having different pressures or environments and a method for transferring the wafer cassette through the load lock unit. More particularly, the invention relates to a dual stage wafer load lock unit wherein first and second chambers of the load lock are selectively separated by a platform carrying the wafer cassette, and a method of transferring wafers in a cassette through the dual stage load lock.

Semiconductor wafer processing typically occurs within high vacuum process chambers which are separated from adjacent chambers and/or external conditions (ambient or atmospheric pressure) by valved openings. Typically, a central transfer chamber is provided with a transfer robot located therein for transferring wafers between a load lock chamber and one or more process chambers located about the periphery of the transfer chamber. The load lock chamber is also provided for transferring wafers between the transfer chamber, which is typically at high vacuum, and the outside, typically a clean room at atmospheric pressure.

One well known prior art system for loading wafers into a process system employs a wafer cassette, having a plurality of individual slots therein, within which individual wafers may be placed or removed. This cassette is placed onto a moveable floor or platform in the load lock chamber, and an elevator mechanism moves the floor in increments to sequentially place, or index, individual slots of the cassette into registration with a robot blade which is used to selectively remove wafers from the cassette or place wafers therein. A slit valve, located in alignment with the robot blade, isolates the load lock chamber from the robot/transfer chamber. To enable access of the robot to all of the slots in the cassette, the cassette must be moveable, within the load lock, to align the wafer slots at each end of the cassette with the robot blade. As a result, the volume of the load lock chamber must be approximately at least twice the volume of the cassette, to create the clearance needed to move the cassette the entire travel length required to access each wafer slot in the cassette with the robot while maintaining the cassette within the controlled environment of the load lock.

To avoid a backflow of ambient air into the transfer chamber, when the valve between the two chambers is opened to transfer a wafer, it is essential that the load lock chamber be maintainable at a pressure substantially equal to the high vacuum of the transfer chamber. Thus, because of the need to have a load lock volume significantly exceeding that of the cassette to enable cassette movement, and thereby robot blade access to each wafer slot in the cassette, a large dead space equal to the required cassette clearance space must be pumped down to vacuum each time a cassette is replaced in the load lock or the load lock door is opened. Additionally, exposing the interior surfaces of the load lock chamber to atmosphere by opening of the load lock door for cassette loading or unloading allows water vapor and contaminants to enter the load lock chamber and adhere thereto.

Accordingly, there is a need in the art for a load lock chamber which provides cassette to wafer indexing while minimizing the volume and space of the load lock which is exposed to ambient conditions.

SUMMARY OF THE INVENTION

According to a first aspect of the present invention, there is provided a load lock apparatus for transferring an article between a first environment at substantially atmospheric pressure and a high vacuum processing system. The apparatus includes a first chamber having an environment which is adjustable between substantially atmospheric pressure and high vacuum and a second chamber having an environment which is maintained in high vacuum. In one aspect of the invention, the second chamber is in selective communication with the vacuum processing system and the first chamber. In another embodiment the first chamber is in selective communication with the vacuum processing system. In another aspect of the invention, the second chamber is used as clearance volume or space maintained at vacuum, and the access to the high vacuum processing system is provided through the first chamber. Also provided is a means for selectively separating the first chamber environment from the second chamber environment. Thus, as a cassette is loaded into the load lock, only the first chamber need be exposed to atmosphere, thereby reducing the surface area of the load lock exposed to water vapor and contaminants, and reducing the volume of the load lock which must be pumped to vacuum. The second chamber, which provides clearance space for movement of the cassette to enable robot access to each wafer slot in the cassette, need only be exposed to the first chamber after the first chamber has been evacuated, and then only when the cassette needs to be positioned to enable access of a robot blade thereto. The environment within the second load lock chamber is preferably maintained at a pressure equal or substantially equal to that maintained in the process chamber environment, such as that in the transfer chamber, and may be configured without an isolation valve between the second chamber and the vacuum processing system.

In one aspect, the selective separating means preferably includes a movable pedestal upon which the article is carried, a dividing ledge extending a distance inwardly prom an inner wall of the apparatus and located between the first and second chambers, and means for sealing the movable pedestal against the dividing ledge when the apparatus is in a loading position. Preferably, an O-ring seal is provided on an upper surface of the pedestal to sealingly engage a lower surface of the dividing ledge when the pedestal is raised to the loading position. The apparatus may further include means for removably connecting together the first chamber, dividing ledge and second chamber.

An article conditioning means may also be provided within the load lock for performing pre-processing and post-processing operations, and preferably includes a movable sub-chamber located within the first load lock chamber. The sub-chamber may exhibit an opening at the side facing the selective separating means between the first chamber and the second chamber. The article conditioning means may include means for heating the area within said movable sub-chamber, the heating means including means for introducing a heated gas into the movable sub-chamber and/or a resistance heating element thermally coupled to the movable sub-chamber. The article conditioning means may also include means for post-process wafer cooling, preferably by introduction of a cooled gas into the movable sub-chamber.

Drive means, may be provided for moving the sub-chamber between an open position and a closed position. Sealing means may also be included to seal the lower surface of the sub-chamber against the dividing ledge when the sub-chamber is in the closed position. The sealing means may include an O-ring seal located on a lower surface of the sub-chamber, to sealingly engage an upper surface of the dividing ledge when the sub-chamber is in the closed position.

A further aspect of the invention is a method for transferring an article between a first environment at substantially atmospheric pressure and a second environment at high vacuum. The article is transferred through a load lock chamber having selectively separable first and second chambers, wherein the second load lock chamber is maintained at high vacuum substantially equal to the high vacuum of the second environment.

According to one preferred embodiment, a method for loading an article, such as a semiconductor wafer cassette carrying one or more semiconductor wafer substrates, into a processing system is provided. First the article is transferred from the atmospheric environment onto a platform in the first load lock chamber while the first load lock chamber is at substantially atmospheric pressure and an opening between said first and second load lock chambers is sealed. The first load lock charmer is then evacuated to a pressure substantially equal to the high vacuum in the second load lock chamber. The seal between the first and second load lock chambers is then broken and the article carried on the platform is transferred from the first chamber to the second chamber. The article is then transferred from the second chamber to the vacuum environment. Alternatively, the access between the cassette and the vacuum environment may be provided in the first chamber, and the second chamber is provided to allow clearance space for the cassette as it is moved to align each cassette wafer slot with a robot or other wafer handling device in the vacuum enclosure.

According to this aspect of the method, wafers may be conditioned or treated subsequent to or during the step of evacuating the first load lock chamber to remove any gas or water vapor which may be present in the pores or on the surface of the wafers. The wafers are preferably conditioned by lowering a sub-chamber to sealingly surround the wafer cassette and then heating the area within the sub-chamber to degas the wafers. The area within the sub-chamber may be heated by introducing a heated gas into the sub-chamber and/or activating a resistive heating element which is in thermal communication with the sub-chamber wall. After degas of the wafers by heating, the wafers may be cooled by introduction of a cool gas into the sub-chamber.

Prior to loading the wafer cassette from the atmospheric environment into the first load lock chamber, the platform may be raised to seal against a lower surface of the dividing ledge. The first load lock chamber may then be purged to substantially atmospheric pressure and the loading door opened to facilitate loading of the wafer cassette. The loading door may then be closed and the opening therein sealed prior to evacuation of the first load lock chamber.

According to another aspect of the method, a method for unloading an article, such a wafer cassette carrying one or more processed semiconductor wafers, from the processing system is provided. First the article is transferred from the vacuum environment onto a platform in the second load lock chamber while the first and second load lock chambers are both at high vacuum and an opening between the chambers is open. The platform is then raised to sealingly close the opening between the load lock chambers. Next, the first load lock chamber is purged to substantially atmospheric pressure, and the loading door is opened for removal of the wafer cassette and processed wafers to the external atmospheric environment. Once the pedestal has been raised and the first load lock chamber sealed from the second load lock chamber, the wafers may be conditioned before the loading door is opened. A sub-chamber located within the first chamber may by lowered to sealingly surround the wafer cassette, and a cool gas can be introduced into the sub-chamber to cool the processed wafers.

These and other features, aspects and advantages of the present invention will become better understood by referring to the following detailed description, drawings and claims, wherein examples of the presently preferred embodiments are given for purposes of illustration and disclosure.

BRIEF DESCRIPTION OF THE DRAWINGS

FIG. 2 is a cross-sectional side view of the load lock shown in FIG. 1, shown in a pre/post process conditioning position;

FIG. 3 is a cross-sectional side view of the load lock shown in FIG. 1, shown in a transfer position;

DETAILED DESCRIPTION

Figure 1:
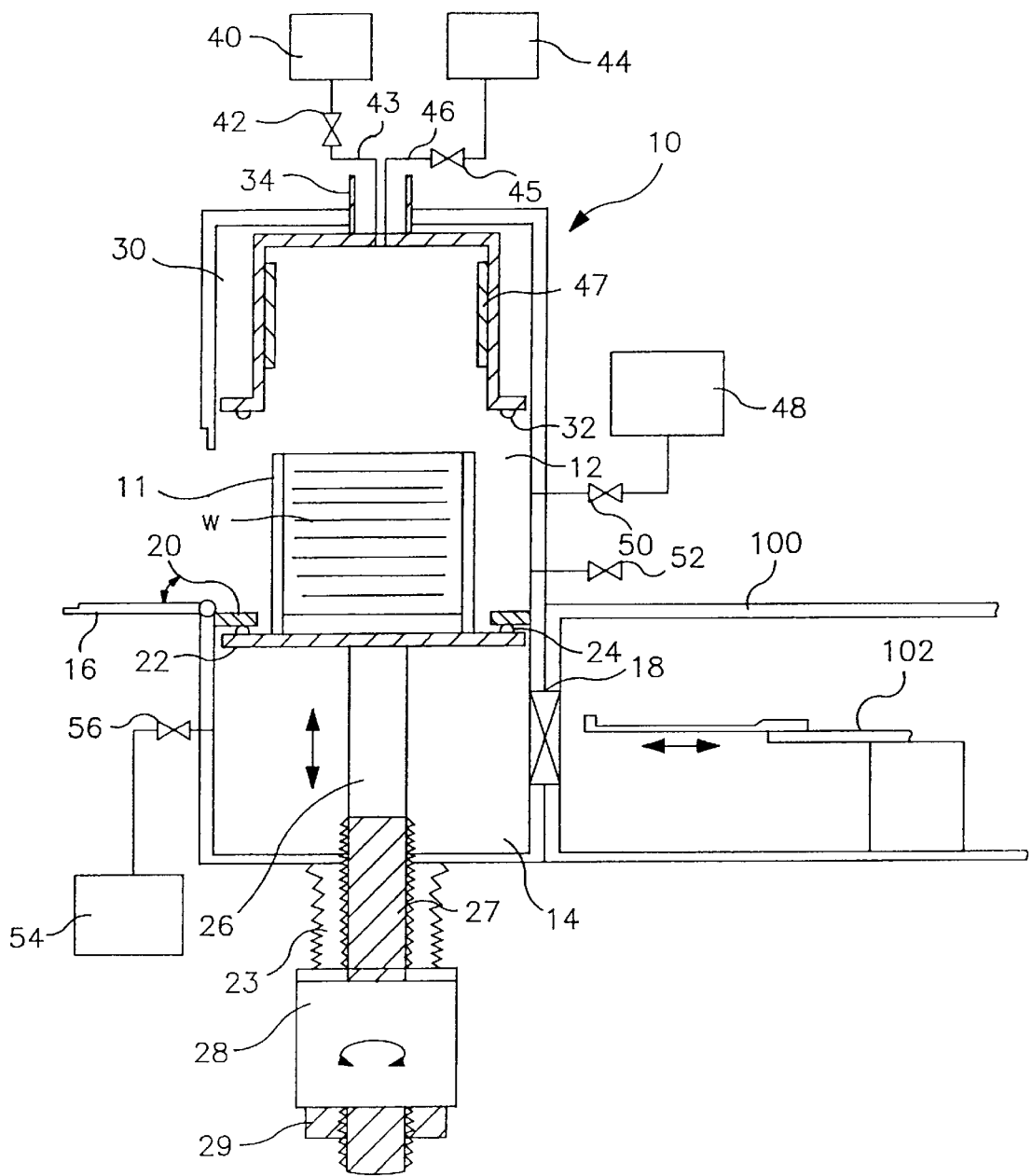
FIG. 1 is a cross-sectional side view of a dual stage load lock according to one embodiment of the present invention, shown in a loading/unloading position.

The present invention is best understood by referring to the Drawings in connection with review of this Description. The present invention is a method and apparatus for transferring an article between a first environment and a second environment. The apparatus includes a first chamber stage having an environment in selective communication with the first environment, and a second chamber stage having an environment in selective communication with the second environment. Also provided is a means for selectively separating the first chamber environment from the second chamber environment. The apparatus may be a modular unit including several parts that can be assembled in different configurations. One aspect of the method includes transfer of the article from an atmospheric environment onto a platform in the first chamber while the first chamber is at substantially atmospheric pressure and an opening between the first and second chambers is sealed, evacuation of the first chamber to a pressure substantially equal to the high vacuum in the second chamber, and communication of the two chambers. The article may then be transferred from the first to second chambers, and thence to the vacuum environment communicable with the second chamber. Another aspect of the method includes transfer of the article from the vacuum environment onto a platform in the second chamber while the first and second chambers are both at high vacuum and an opening between the chambers is open. The platform is then raised to sealingly close the opening between the chambers. The first chamber is then vented to substantially atmospheric pressure, and the loading door is opened for removal of the article. In a still further aspect of the method, the second chamber provides evacuated clearance space, into which the cassette is extended, after the first chamber pressure or environment is equalized with the second chamber, and the valve between the load lock and vacuum processing system may extend into the first chamber.

FIGS. 1–3 show a first preferred embodiment of a dual stage load lock 10 for housing wafers W during transfer between an external environment, such as a clean room, at atmospheric pressure, and a processing system at high vacuum. The dual stage load lock 10 includes a first or upper chamber 12 and a second or lower chamber 14. A loading door 16 is provided in a wall of the first chamber 12 to facilitate loading and unloading of wafer cassettes 11 into and from the first chamber 12. A valve 18, such as a slit valve, is provided in a wall of the second chamber 14 separating the load lock chamber 10 from a central transfer chamber 100 of the wafer processing system. The valve 18 may be opened to permit a wafer handling robot 102 to extend into the lower chamber 14 to pick up or drop off a wafer W in the wafer cassette 11 maintainable in the load lock 10.

A dividing ledge 20 is located between the upper chamber 12 and the lower chamber 14, and extends a distance inwardly from the inner wall of the load lock 10. When the load lock 10 is in the wafer cassette loading/unloading position, as shown in FIG. 1, the lower chamber 14 is separated from the upper chamber 12 by a wafer transport pedestal 22. An O-ring seal 24, which is preferably located on an upper surface of the pedestal 22 along the periphery thereof, engages a lower surface of the dividing ledge 20 to provide an air-tight seal between the first chamber 12 and second chamber 14, when the apparatus is in the loading position.

The pedestal 22 is connected to the upper end of a drive shaft 26, which extends downwardly therefrom through a sealed opening in the floor of the lower chamber 14. A bellows assembly 23 may be used to seal the opening in the chamber floor. Although the bellows assembly shown in FIG. 1 is external to the load lock chamber 10, it is also contemplated to have the bellows assembly located within the chamber 10. The pedestal 22 may be raised or lowered by actuation of an external drive mechanism. Currently, two types of external drive systems are used: servo-motor drive systems and pneumatic drive systems. As shown in FIG. 1, the presently preferred drive mechanism is a servo-type motor 28, which permits incremental adjustment and positioning of the pedestal 22 within the chamber. The drive motor 28 is preferably a standard AC, DC or step servo-motor. Alternatively, magnetic or electromagnetic motors may be used depending upon the system requirements.

The drive motor 28 surrounds the drive shaft 26, and upon actuation, rotates about a lead screw portion 27 of the drive shaft 26. The drive motor 28 is connected to a threaded drive flange 29. The threads of the threaded drive flange 29 engage threads of the lead screw 27 portion of the drive shaft 26. As the motor 28 is activated, the motor and threaded drive flange 29 rotate about the shaft. The shaft remains fixed in theta, i.e., against rotation, and as the drive mechanism rotates, the drive shaft moves vertically along its longitudinal axis due to the threaded connection between the lead screw 27 and drive flange 29. The shaft may be fixed against rotation by a variety of mechanisms. For example, a longitudinal groove may be formed in the shaft with a projection from a surrounding fixed surface extending into the groove to prevent rotation of the shaft. Rotation of the drive motor 28 in one direction, for example clockwise, results in vertical movement in one direction of the drive shaft, i.e. upward, while rotation of the drive motor in the opposite direction, i.e. counterclockwise, results in vertical movement of the drive shaft in the opposite, or downward, direction.

The drive mechanism, including the drive shaft 26, drive motor 28, and threaded drive flange 29 has a holding force sufficient to withstand the tremendous downward pressure (2500 PSI +) exerted on the pedestal when the first chamber 12 is at atmospheric pressure and the second chamber is at high vacuum. To meet the requirements, the drive motor 28 is provided with a large amount of holding torque, the drive shaft 26 exhibits a larger than normal diameter, and the lead screw threads are finely pitched.

A bell-housing sub-chamber 30 may be located in the upper chamber 12, movable between a first, retracted, position as shown in FIG. 1, and second, engaged, position as shown in FIGS. 2 and 3. An O-ring seal 32 surrounds a lower edge of the sub-chamber 30 such that the sub-chamber 30 will be sealed against the upper surface of the dividing ledge 20 when the sub-chamber 30 is in the engaged position. The sub-chamber 30 may be moved between the engaged position and the retracted position by an electrical or pneumatic drive mechanism. As shown in the presently preferred embodiment, a drive shaft 34 has a first end connected to the sub-chamber 30 and a second end connected to a piston 36, which is movably located in a pneumatic drive cylinder 38, which is connected to a pneumatic source which drives the piston 36. The sub-chamber 30 is used to provide a second environment about the wafer cassette when the cassette is in the first chamber 12 and the first chamber 12 is isolated from the second chamber 14. This is accomplished by extending the sub-chamber 30 body downwardly (in this embodiment) against the pedestal 22, over the cassette.

The wafers W in the wafer cassette 11 may be subjected to a pre-processing or post-processing operation when the sub-chamber 30 is in the engaged position and the pedestal 22 is in the loading position, as shown in FIG. 2. A pre-processing operation, such as degas to remove water vapor on the surface and in pores of the wafers is performed, by heating the region within the sub-chamber, by electrical, optical or infra-red heating means and/or by introducing hot gas into the sub-chamber. The sub-chamber 30 is preferably formed of a material having a high resistance to heat, such as stainless steel.

According to one preferred embodiment, a heated gas, such as argon or nitrogen, from a gas source 44, may be introduced into the sub-chamber 30 through valve 45 and conduit 46. An electrical radiant heater 47 may also be used in conjunction with the hot gas to heat the region within the sub-chamber to a temperature of about 350° C. Once the degas process is complete, the wafers may be cooled by introducing a cool gas, such as argon or nitrogen, into the sub-chamber through valve 45 and hose 46. The wafers are preferably cooled to about 70° C.

After pre-processing, with the sub-chamber 30 still in the engaged position and the pedestal 22 is in the loading position, as shown in FIG. 2, the sub-chamber may be evacuated to high vacuum substantially equal to the high vacuum environment in the lower chamber 14. A vacuum pump 40 is connected to the sub-chamber via valve 42 and vacuum line 43. With the sub-chamber 30 sealed against the upper surface of the dividing ledge, the vacuum pump is activated until the pressure within the sub-chamber is substantially the same as the pressure in the lower chamber. For example, where the pressure in the lower chamber is maintained at between $10^{-7}$ Torr and $10^{-9}$ Torr, the sub-chamber must be evacuated to a pressure of at least $10^{-5}$ Torr prior to lowering the pedestal 22 and breaking the seal between the first and second chambers. Thus, the sub-chamber 30, where used, reduces the volume of the first chamber 12 which must be pumped down for each cassette load operation.

Alternatively, the pre-processing step can be omitted and the upper chamber 12 evacuated to high vacuum by a vacuum pump 48 connected directly to the upper chamber 12 by a valve 50 and vacuum line 51. The degas step may also be omitted where the sub-chamber has been placed in the closed position, as shown in FIG. 2, and the sub-chamber 12 is only evacuated to high vacuum as described above. A primary advantage of using the sub-chamber is that its smaller volume significantly reduces the time needed to evacuate the chamber.

Prior to opening the loading door 16, exposing the load lock 10 to the external atmosphere, the first chamber 12 is purged to atmospheric pressure via purge valve 52. While the pressure in the first chamber 12 is permitted to fluctuate between atmosphere and high vacuum, the second chamber 14 is maintained at a high vacuum, typically between $10^{-7}$ Torr and $10^{-9}$ Torr, by a vacuum pump 54 and valve 56.

The method of transferring a wafer cassette from the external clean room through the load lock and into the transfer chamber 100 is sequentially shown in FIGS. 1–3. The method of unloading wafers from the system through the load lock to the external environment occurs in reverse sequence.

Prior to loading a wafer cassette 11 carrying a plurality of wafers W into the load lock 10, the platform 22 must be raised to seal against the dividing ledge 20, thus preventing exposure of the second chamber 14 to atmosphere. The first chamber 12 (and the sub-chamber 30 when used) is then purged, via purge valve 52, to a pressure substantially equal to the external air pressure, typically atmospheric pressure. Purging is accomplished by venting the first chamber 12 to atmosphere. The loading door 16 is then opened, and a cassette 11 is placed on the platform 22. The loading door is then closed to seal the first chamber 12 from the outside atmosphere.

Next, the sub-chamber 30, when used, is lowered such that the O-ring seal 32 seats on the upper surface of the dividing ledge 20 and seals the inner region of the sub-chamber. A pre-processing operation, such as degas, may then be performed. Once a sufficient amount of time has elapsed to remove water vapor from the wafers, a cool gas may be introduced into the sub-chamber to cool the wafers to a temperature of about 70° C. The volume within the sub-chamber 30 is then evacuated to a pressure approximately equal to the high vacuum in the second chamber 14. For example, where the second chamber is maintained at a high vacuum between about $10^{-7}$ Torr and $10^{-9}$ Torr, the sub-chamber 30 must be pumped down to approximately $10^{-5}$ Torr prior to breaking the seal between the first and second chambers by lowering the platform 22.

Once the pressure between the sub-chamber 30 and lower chamber 14 is substantially equalized, the platform 22, carrying the wafer cassette 11, is lowered into the second chamber 14 by actuating the drive motor 28. The platform 22 is lowered to a position where an end effector of the robot 102 may pass through the slit valve 18 and retrieve a wafer W from the cassette 11. The position of the platform may be further adjusted vertically to allow the robot to select another stacked wafer from the cassette. This process is repeated for all wafers in the cassette.

Processed wafers are unloaded from the system, ie, re-loaded into the cassette, in substantially the reverse manner. Individual processed wafers are transferred by the robot 102 from the transfer chamber 100 to the wafer cassette 11 which is positioned in the lower chamber 14 while the opening between the upper and lower chambers remains open and both chambers are at high vacuum. Once the cassette 11 is filled with processed wafers, the motor 28 is actuated to raise the platform 22 until the O-ring seal 24 seats against the lower surface of the dividing Ledge 20. With the sub-chamber 30 in the closed position, a cool gas may be introduced into the sub-chamber to cool the wafers if needed. The sub-chamber 30 may then be raised to the open position and the environment within the first chamber purged, via purge valve 52, to atmospheric pressure. The loading door 16 may then be opened to remove the wafer cassette from the load lock.

Figure 4:
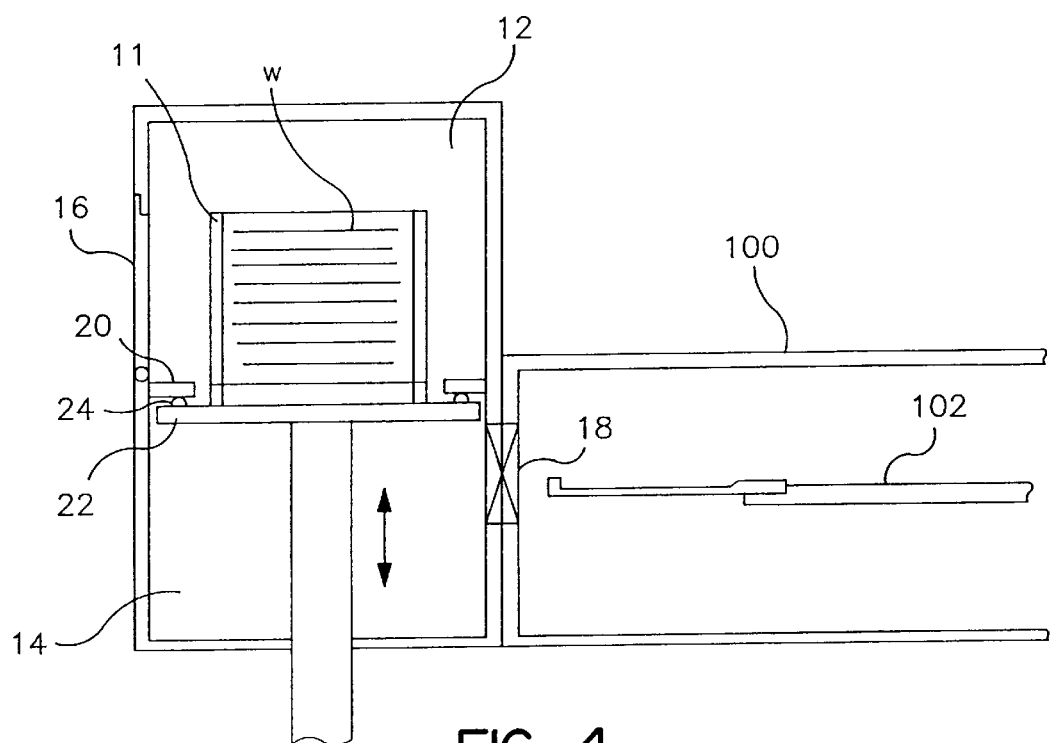
FIG. 4 is a cross-sectional side view of a dual stage load lock according to an alternative embodiment of the present invention.

An alternative preferred embodiment of the invention is shown in FIG. 4. The load lock according to this embodiment is similar to the load lock shown in FIGS. 1–3, wherein like reference numerals indicate like components, except that no sub-chamber is provided for pre-processing and post-processing operations. Consequently, the volume of the first chamber 12 may be smaller than that of the load lock of FIGS. 1–3, which is required to accommodate the sub-chamber therein.

Figure 5:
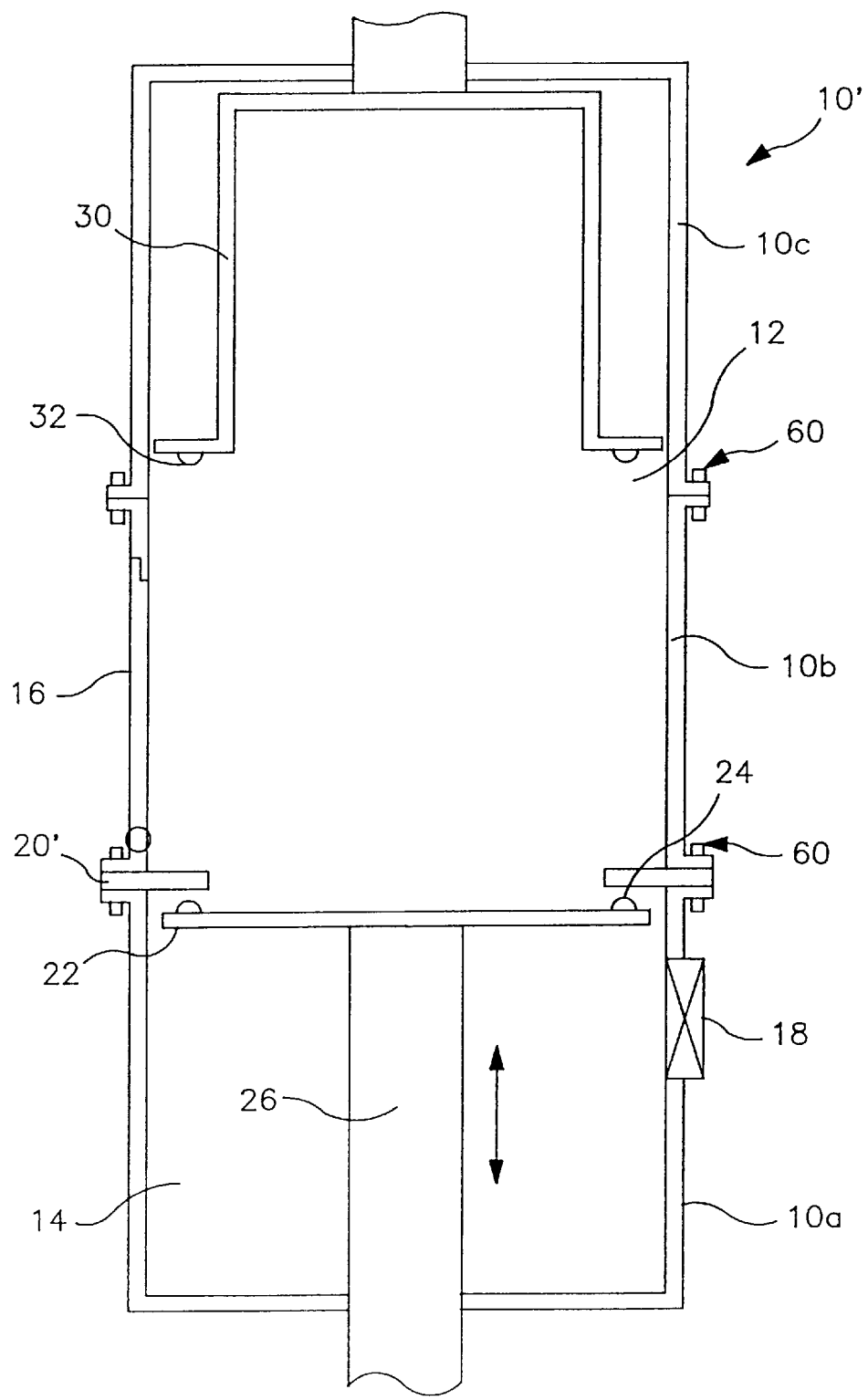
FIG. 5 is a cross-sectional side view of a modular dual stage load lock according to a further alternative embodiment of the present invention.
Figure 6:
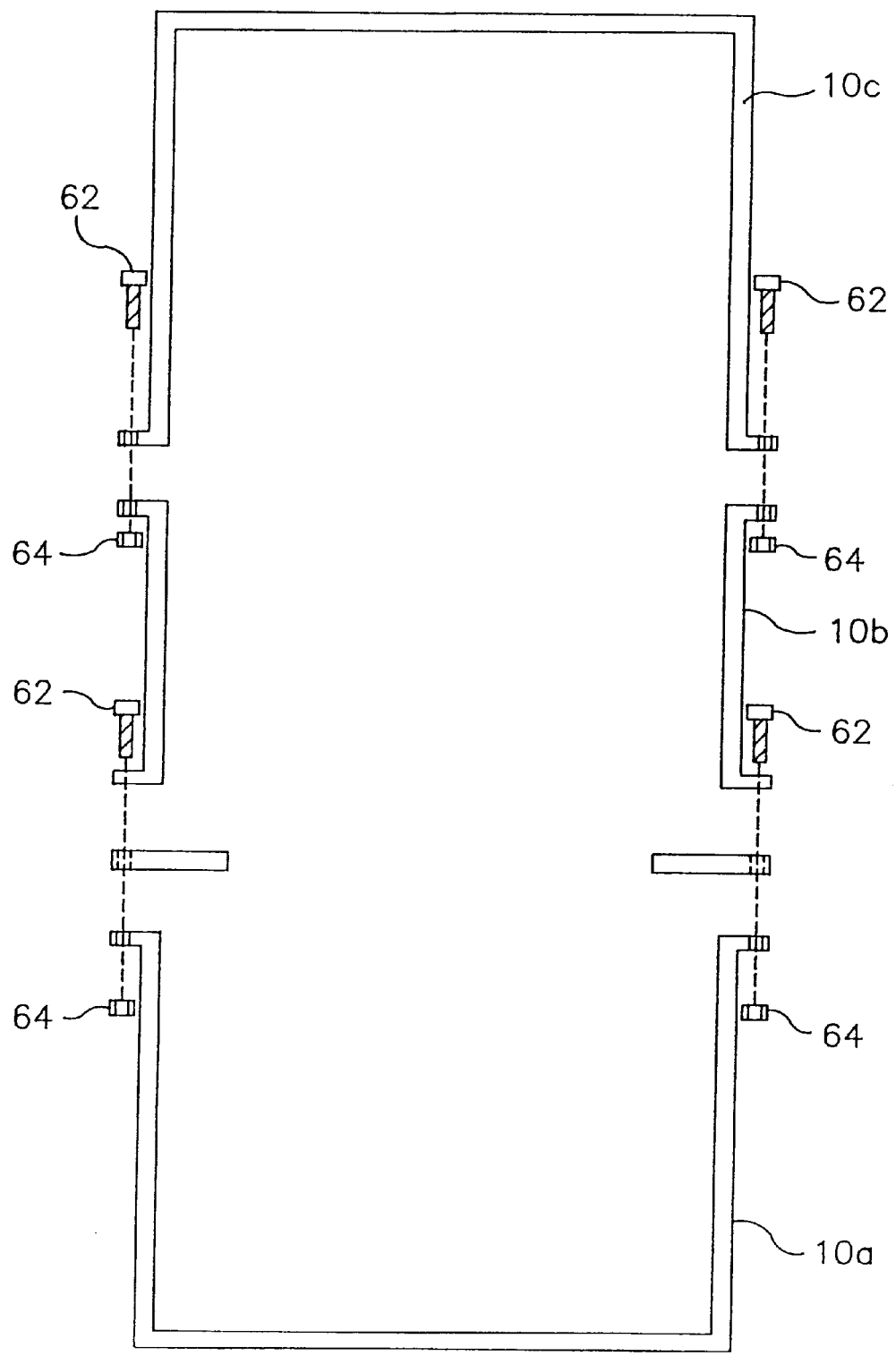
FIG. 6 is an exploded cross-sectional side view of the modular dual stage load lock of FIG. 5, with selected components removed for clarity.
Figure 7:
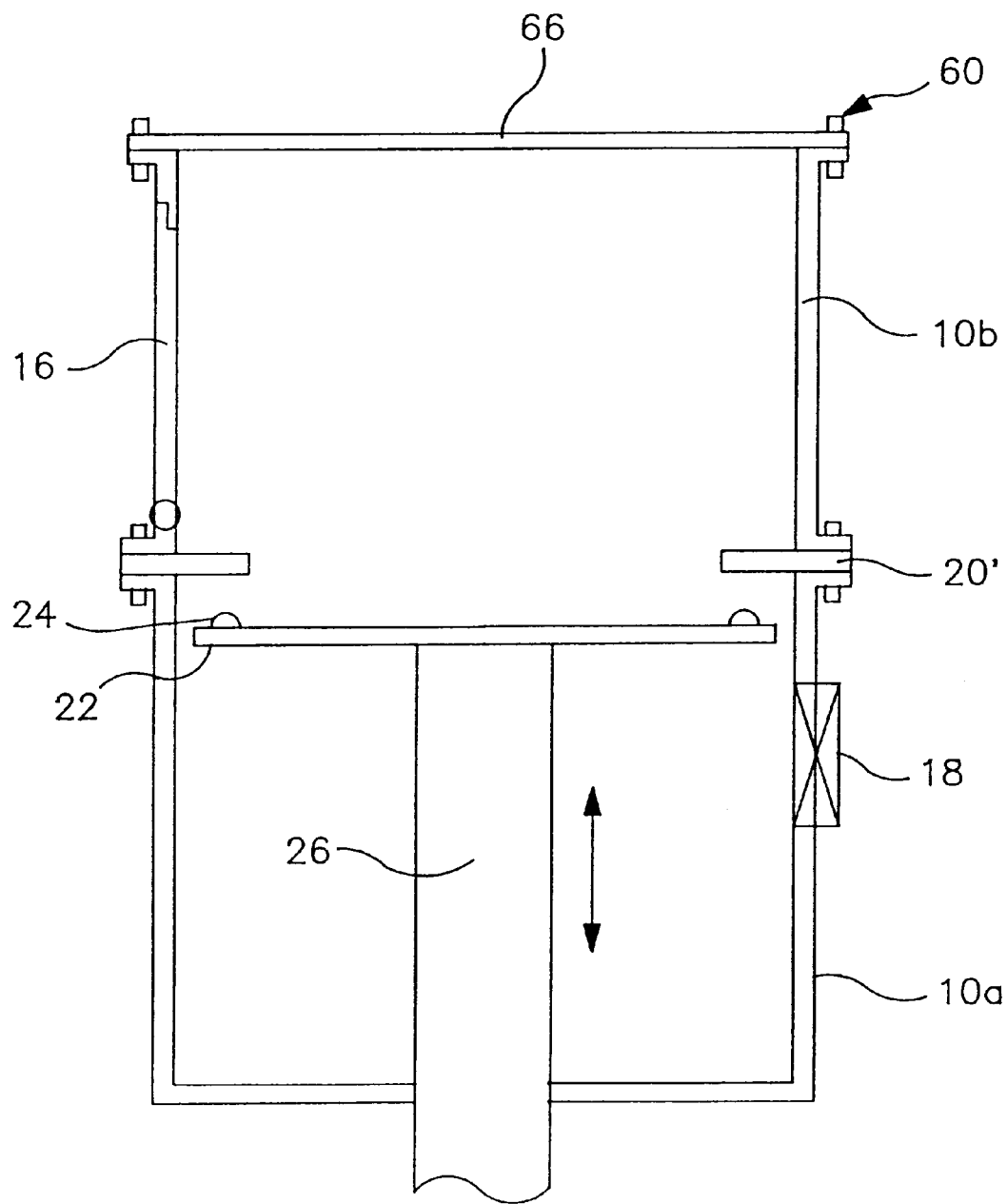
FIG. 7 is a cross-sectional side view of a modular dual stage load lock according to a still further embodiment of the present invention.

FIGS. 5–7 show a modular load lock assembly 10' according to another embodiment of the present invention. The modular load lock assembly 10' includes a first chamber segment 10a for housing a substantially horizontal pedestal 22 upon which a wafer cassette is carried, and a second chamber segment 10b positioned above the first chamber segment 10a. A dividing ledge 20' is positioned between the first and second chamber segments and extends inwardly from the inner wall of the modular load lock assembly. The first chamber segment 10a, dividing ledge 20' and second chamber segment 10b are removably connected together by a plurality of fasteners 60 located about the periphery thereof. Each fastener may preferably include a threaded bolt 62 and a corresponding nut 64. The first chamber segment 10a, dividing ledge 20' and pedestal 22 define the second or lower load lock chamber 14.

According to one preferred configuration of the modular load lock assembly, as shown in FIGS. 5 & 6, a third chamber segment 10c is positioned above the second chamber segment 10b, and is removably connected thereto by a plurality of fasteners 60, wherein each fastener preferably includes a bolt 62 and nut 64. A movable sub-chamber 30, having an opening corresponding with the opening in the third chamber segment, may be located within the third chamber segment 10c, for performing pre-process and post-process operations. The dividing ledge, pedestal and second and third chamber segments combine to define the first or upper load lock chamber 12.

According to an alternative configuration of the modular load lock assembly, as shown in FIG. 7, a plate 66 is positioned over the upper opening of the second chamber segment 10b, and is removably connected thereto by a plurality of fasteners 60, wherein each fastener preferably includes a bolt 62 and nut 64. The first or upper load lock chamber 12 in this configuration is defined by the plate 66, second chamber segment 10b dividing ledge 20' and pedestal 22. The volume of the first chamber 12 in this configuration is smaller than the volume of the first chamber in the configuration shown in FIGS. 5 & 6 because the chamber need not accommodate a sub-chamber for pre-process and post-process operations.

Other than the modularity of components, the modular load lock shown in FIGS. 5–7 includes the same or similar components as the load lock shown in FIGS. 1–4. The environment of the second chamber 14 is preferably in selective communication with an adjacent high vacuum transfer chamber 100 and is maintained as a high vacuum system, while the environment of the first chamber 12 is in selective communication with the outside environment at substantially atmospheric pressure. The first chamber 12 may include means for adjusting the environment therein between substantially atmospheric pressure and high vacuum as described above.

The present invention, therefore, is well adapted to carry out the objects and attain the ends and advantages mentioned as well as others inherent therein. While presently preferred embodiments of the invention are given for the purpose of disclosure, numerous changes in the details will readily suggest themselves to those skilled in the art and which are encompassed within the spirit of the invention and the scope of the appended claims.

Figure 8:
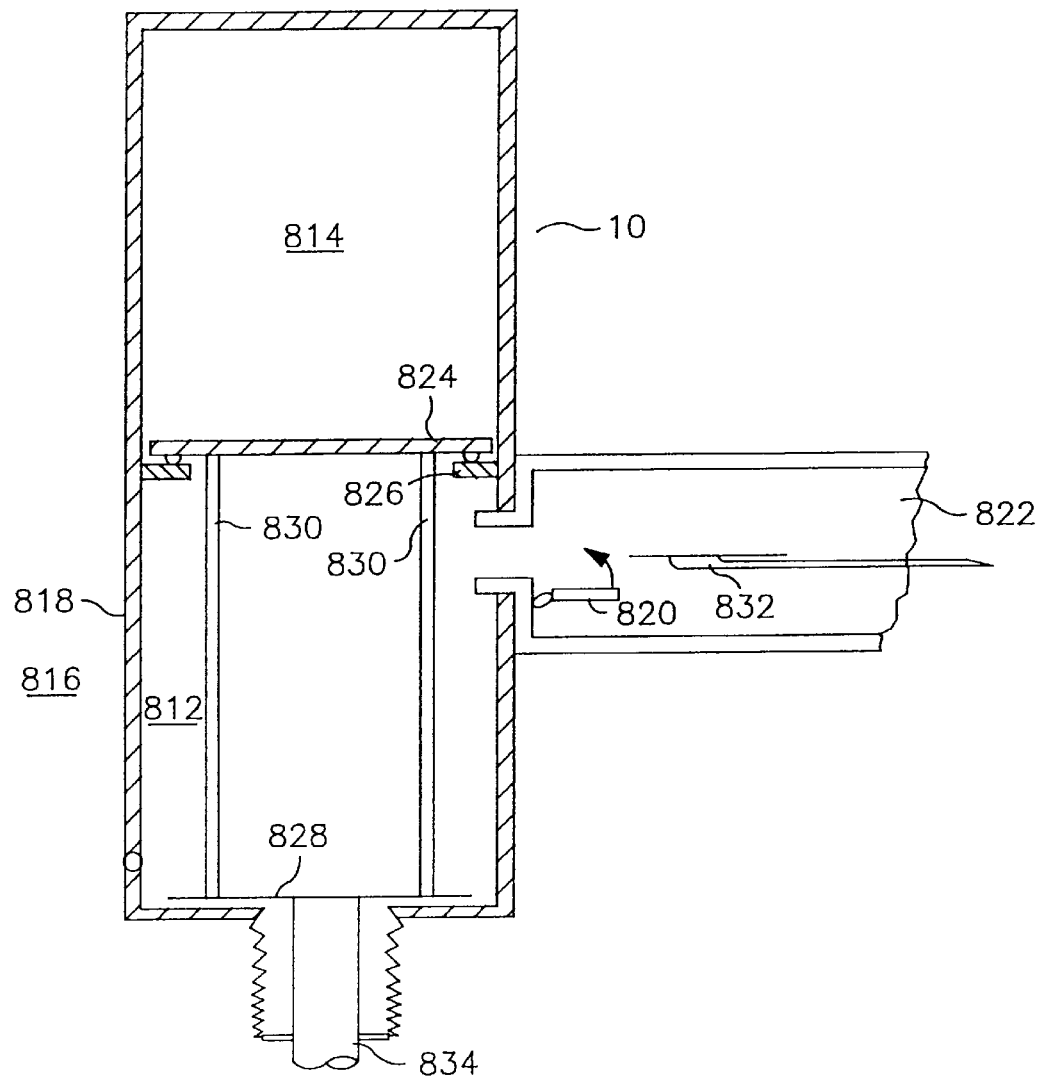
FIG. 8 is a cross-sectional side view of an additional embodiment of the present invention.

Additionally, as shown in FIG. 8 tie load lock 10 may be configured such that the first chamber 812 is accessed to atmosphere 816 through a sealable door 818 for cassette access, and also valved via a slit valve 820 to the adjacent processing system 822. In this configuration the second chamber 814, which is selectively, and sealingly, isolatable from the first chamber 816 via a plate 824 sealable to a flange 826 between the first chamber 812 and second chamber 814, provides a volume which provides space to enable movement of a wafer cassette on a stage 828 to index each wafer slot therein with the robot blade. Advantageously, the space provided by the second chamber 814 is not exposed to atmosphere, and thus need not be pumped to atmosphere each time a cassette is loaded into the system, which results in reduced pump down time for the load lock chamber 10.

To selectively seal the second chamber 814 from the first chamber 812, the plate 824 is positioned within the second chamber 814, and extends radially outwardly over the flange 826. Additionally, the plate 824 is rigidly connected to stage 828 (on which the wafer cassette is positioned), via a plurality of risers 830 which are affixed to the stage 828 about its periphery to provide clearance to place a cassette on the stage 828. Stage 828 is moveable within first chamber 812 to index different wafer support positions in the cassette in alignment with a robot blade 832.

I claim:

1. A load lock apparatus for transferring an article between a first environment at substantial atmospheric pressure and a high vacuum processing system comprising:

a first chamber having an environment adjustable between substantially atmospheric pressure and vacuum and in selective communication with said first environment;

a second chamber maintained in high vacuum and in selective communication with said first chamber;

one of said first chamber and said second chamber in selective communication with said processing system;

a cover for selectively separating said first chamber environment from said second chamber environment;

a valve for providing selective communication between said first chamber and said vacuum processing system;

an aperture between said first chamber and said second chamber, and an aperture cover selectively sealingly blocking communication of said first chamber and said second chamber via said aperture;

wherein said aperture cover is a plate located within said second chamber;

said first chamber further including a moveable stage upon which the article is positionable; and wherein said plate is connected to, and positioned within said second chamber by positioning of said stage.

2. A method for transferring an article between an ambient atmospheric pressure environment and a processing vacuum environment, through a load lock chamber having loading and transfer chambers that are separated by a ledge having an opening for passing the article there between, the ledge having a first side that faces the loading chamber and a second side that faces the transfer chamber, comprising:

moving an article-bearing stage contained within the transfer chamber toward the second side to operably abut the ledge to create fluid isolation between the loading and transfer chambers to allow ambient atmospheric and vacuum pressures to coexist in the loading and transfer chambers respectively;

loading the article from the first ambient atmospheric pressure environment into the loading chamber onto the article-bearing stage while the loading chamber is at ambient atmospheric pressure and in fluid isolation from the transfer chamber with the transfer chamber being at a vacuum pressure;

moving a moveable subchamber contained within the loading chamber toward the article-bearing stage to cooperate with the ledge and article bearing stage to create a sealing surroundment of the article;

evacuating the moveable subchamber to a pressure substantially equal to the vacuum of the transfer chamber;

lowering the article-bearing stage away from the second side of the ledge, whereby the article is moved from the loading chamber into the transfer chamber;

transferring the article from the transfer chamber to the processing vacuum environment.

3. The method of claim 2, further comprising conditioning the article after the step of moving the moveable subchamber to cooperate with the ledge and article bearing stage to create a sealing surroundment of the article, but prior to the step of moving the article from the loading chamber to the transfer chamber.

4. A method for transferring an article between a first ambient atmospheric pressure environment and a processing vacuum environment, through a load lock chamber having selectively separable first and second chambers, comprising:

maintaining the second chamber at a vacuum;

transferring the article from the processing environment onto a controllably moveable pedestal in the second chamber while an interior region of the first chamber exterior to a moveable subchamber within the first chamber is in fluid isolation from the second chamber;

moving the pedestal upward to position the article into the moveable subchamber and to cause the pedestal to cooperate with a ledge projecting inward from the load lock chamber to create fluid isolation between the subchamber and second chamber to allow ambient atmospheric pressure and high vacuum to coexist in the subchamber and second chamber respectively;

adjusting the moveable subchamber to ambient atmospheric pressure;

raising the moveable subchamber; and transferring the article from the first chamber to the first ambient atmospheric pressure environment.

5. The method of claim 4, further comprising conditioning the article after the step of fluid isolation between the first and second chambers, but before the step of raising the moveable subchamber.

* * * * *